United States Patent
Duckworth et al.

(10) Patent No.: US 6,429,671 B1
(45) Date of Patent: Aug. 6, 2002

(54) ELECTRICAL TEST PROBE CARD HAVING A REMOVABLE PROBE HEAD ASSEMBLY WITH ALIGNMENT FEATURES AND A METHOD FOR ALIGNING THE PROBE HEAD ASSEMBLY TO THE PROBE CARD

(75) Inventors: Koby L. Duckworth; Miguel L. Islas, both of Austin; Timothy Eric Gilliam, Dripping Springs, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/199,608

(22) Filed: Nov. 25, 1998

(51) Int. Cl.[7] .......................... G01R 31/02; G01B 11/00
(52) U.S. Cl. ...................... 324/758; 324/765; 356/401
(58) Field of Search .................. 324/758, 761, 324/754, 762; 356/400, 401

(56) References Cited

U.S. PATENT DOCUMENTS

| | | | | |
|---|---|---|---|---|
| 5,088,190 A | * | 2/1992 | Malhi et al. | 324/758 |
| 5,189,363 A | * | 2/1993 | Bregman et al. | 324/762 |
| 5,412,329 A | * | 5/1995 | Iino et al. | 324/754 |
| 5,949,244 A | * | 9/1999 | Miley | 324/758 |

* cited by examiner

Primary Examiner—Ernest Karlsen
(74) Attorney, Agent, or Firm—Kevin L. Daffer; Conley, Rose & Tayon P.C.

(57) ABSTRACT

An electrical test probe card is presented including a removable probe head assembly with alignment features, as well as a method for aligning the probe head assembly to the probe card. The probe head assembly is used to provide an electrical interface between an interface circuit and a semiconductor device under test. The probe head assembly includes a probe head body having a pair of opposed surfaces. A set of probe holes and a set of alignment holes extend between the opposed surfaces. Each probe hole is adapted to receive an electrically conductive probe, and each alignment hole is adapted to pass optical illumination used to align the probe head body with the interface circuit. The probe holes are arranged according to a first pattern defined by a set of electrical contacts on a surface of the device under test. A surface of the interface circuit includes a set of electrical contacts arranged according to the first pattern, and a set of alignment marks defining a second pattern. Each probe hole thus has a corresponding electrical contact on the surface of the device under test, and a corresponding electrical contact on the surface of the interface circuit. The alignment holes are arranged according to the second pattern such that each alignment hole has a corresponding alignment mark on the surface of the interface circuit.

6 Claims, 5 Drawing Sheets

ELECTRICAL TEST PROBE CARD HAVING A REMOVABLE PROBE HEAD ASSEMBLY WITH ALIGNMENT FEATURES AND A METHOD FOR ALIGNING THE PROBE HEAD ASSEMBLY TO THE PROBE CARD

BACKGROUND OF THE INVENTION

1. Field of the Invention

This invention relates to semiconductor device electrical test systems, and more particularly to semiconductor device electrical test systems employing probe cards with removable probe heads.

2. Description of Related Art

A wafer fabrication process typically forms multiple identical integrated circuits upon and within frontside surfaces of each of several semiconductor wafers processed as a group (i.e., lot). Each individual integrated circuit is formed within a die area of one of the semiconductor wafers. Following wafer fabrication, the dice are subjected to "wafer sort" electrical testing, then separated from the wafers. Fully functional die are typically packaged and sold as individual semiconductor devices.

Wafer sort electrical testing is performed to ensure each integrated circuit functions properly according to a predetermined electrical specification. Following wafer fabrication, each wafer is typically placed upon a flat surface of a test system with the frontside surface facing up. A wafer under test is raised up until bonding pads of one of the integrated circuits contact many fine wires or "test probes" of the test system. The test system may provide electrical power to the integrated circuit via some of the test probes, and may provide input signals and/or receive output signals from the integrated circuit via other test probes. The wafer under test is lowered, repositioned, and raised again until all of the integrated circuits formed on the wafer under test have been tested.

A modem integrated circuit may have several hundreds of very small bonding pads arranged within a rectangular die area having a surface area of about half a square inch. As a result, several hundreds of closely spaced test probes may be required to carry out the electrical testing during wafer sort. The fine wire test probes are delicate and easily damaged. Further, they are typically uninsulated, and must remain spaced apart to prevent shorting and to reduce inter-probe capacitance.

A typical modem test system includes a "probe card" which functions as an electrical interface between the test system and the device under test. The probe card effects a transition from relatively large electrical conductors (i.e., wires) used within the test system to the fine wire test probes which contact the bonding pads of the device under test. FIG. 1 is a bottom plan view of a typical probe card 10 which includes a circular printed circuit board (PCB) 12 having two opposed surfaces. Probe card 10 may be, for example, a COBRA® probe card (Wentworth Laboratories, Brookfield, Conn.). One surface of PCB 12 is connected to a metal mounting ring 14 about a periphery. An alignment ring 16 and an interface circuit 18 are connected to the other surface of PCB 12. A removable probe head assembly 20 including a probe head body 22 is adapted for mounting within alignment ring 16 as shown.

FIG. 2 is a sectional view of typical probe card 10 as indicated in FIG. 1. Probe head body 22 has a pair of opposed surfaces and a set of probe holes extending between the opposed surfaces. The probe holes are arranged according to a pattern defined by electrical contacts 26 on a surface of a device under test 28. Electrical contacts 26 may include solder bumps formed upon flat metal pads as shown in FIG. 2.

Probe head assembly 20 includes a set of contact probes 24 each having two ends. Each contact probe 24 extends through a probe hole in probe head body 22 such that the ends of contact probe 24 project outwardly from the opposed surfaces of probe head body 22. A pair of alignment pins 25a–b protruding from probe head body 22 fit into corresponding holes in alignment ring 16 when probe head body 22 is coupled to alignment ring 16.

PCB 12 has two sets of bonding pads: a first set of bonding pads 29 on the surface of PCB 12 to which mounting ring 14 is connected, and a second set of bonding pads 30 on the opposite surface of PCB 12 adjacent to interface circuit 18. PCB 12 includes electrically conductive metal traces, insulated by fiberglass-epoxy dielectric material, which interconnect bonding pads 29 and bonding pads 30. Bonding pads 29 are connected to the test system, and bonding pads 30 are connected to corresponding bonding pads of interface circuit 18.

Interface circuit 18 has a set of bonding pads 32 on one of two opposed surfaces, and a set of contact pads 34 on the other of the two opposed surfaces. Bonding pads 32 are located on a surface of interface circuit 18 adjacent to PCB 12, and are connected to corresponding bonding pads 30 of PCB 12. Contact pads 34 are electrically conductive flat metal pads formed flush with a surface of interface circuit 18 opposite PCB 12. Contact pads 34 are arranged according to the pattern defined by electrical contacts 26 on the surface of device under test 28. Interface circuit 18 includes electrically conductive metal traces, typically insulated by a ceramic dielectric material, which interconnect bonding pads 32 and contact pads 34.

During testing, probe head body 22 is brought proximate the surface of device under test 28 such that one end of each contact probe 24 contacts a corresponding electrical contact 26 on the surface of device under test 28. When probe head body 22 is properly aligned with and mechanically coupled to interface circuit 18, the other end of each contact probe 24 contacts the corresponding contact pad 34 of interface circuit 18. Electrically conductive signal paths are formed between the test system and contact probes 24 via PCB 12 and interface circuit 18. The test system provides electrical power and input signals destined for device under test to bonding pads 29 on PCB 12, and also monitors output signals produced by device under test 28 via bonding pads 29. The electrical power, input signals, and output signals are conveyed to and from device under test 28 via electrical signal paths formed through PCB 12, interface circuit 18, and contact probes 24 of probe head assembly 20.

Correct operation of the test system requires proper alignment between probe head body 22 and interface circuit 18. As described above, interface circuit 18 is firmly attached to PCB 12. Screw fasteners are typically used to attach alignment ring 16 to PCB 12, and to attach probe head assembly 20 to alignment ring 16. Subject to mechanical wear and tear, probe head assemblies are routinely removed from probe cards for maintenance and repair.

A problem arises when attaching probe head assembly 22 to alignment ring 16 following maintenance or repair. The mechanical tolerances associated with the screw fasteners are great enough to require tedious and time consuming manual adjustment of the alignment between alignment ring 16 and PCB 12, as well as the alignment between probe head assembly 20 and alignment ring 16, in order to attain correct test system operation. It is noted that alignment pins 25a–b reduce, but do not eliminate, the mechanical alignment problem. As probe head body 22 is typically opaque, visual verification of alignment between probe head body 22 and interface circuit 18 is made impossible, essentially reducing the alignment process to one of trial and error.

It would thus be desirable to have a probe card which provides for alignment of the probe head body directly to the interface circuit, and an associated alignment method. Such an apparatus and method would eliminate the required tedious and time consuming manual adjustment of the alignment between alignment ring 16 and PCB 12, and between probe head assembly 20 and alignment ring 16, in order to attain correct test system operation following replacement of a probe head assembly.

SUMMARY OF THE INVENTION

The problems outlined above are in large part solved by an electrical test probe card including a removable probe head assembly with alignment features, and a method for aligning the probe head assembly to the remainder of the probe card. The probe card includes a removable probe head assembly used to provide an electrical interface between an interface circuit and a semiconductor device under test. The probe head assembly includes a probe head body having a pair of opposed surfaces. A set of probe holes and a set of alignment holes extend between the opposed surfaces. Each probe hole is adapted to receive an electrically conductive probe, and each alignment hole is adapted to pass optical illumination used to align the probe head body with the interface circuit.

The probe holes are arranged according to a first pattern defined by a set of electrical contacts on a surface device under test. A surface of the interface circuit includes a set of electrical contacts arranged according to the first pattern, and a set of alignment marks defining a second pattern. Each probe hole thus has a corresponding electrical contact on the surface of the device under test, and a corresponding electrical contact on the surface of the interface circuit. The alignment holes are arranged according to the second pattern such that each alignment hole has a corresponding alignment mark on the surface of the interface circuit.

The probe head assembly also includes a set of contact probes each having two opposed ends. Each contact probe extends through a probe hole such that the ends of the contact probes project outwardly from the opposed surfaces of the probe head body. During testing, each contact probe acts as an electrical conductor between a corresponding electrical contact on the surface of the device under test and a corresponding electrical contact on the surface of the interface circuit.

During attachment of the probe head assembly to the remainder of the probe card, one of the pair of opposed surfaces of the probe head body is brought into contact with the surface of the interface circuit including the electrical contacts and the alignment marks. When an end of each contact probe contacts the corresponding electrical contact on the surface of the interface circuit, the probe head body is properly aligned with the interface circuit, and the optical illumination passing through any member of the set of alignment holes illuminates the corresponding alignment mark upon the surface of the interface circuit.

The electrical contacts on the surface of the interface circuit are preferably grouped toward the center of the surface, and the alignment marks are preferably positioned between the electrical contacts and a periphery of the surface. For example, the surface of the interface circuit may be rectangular, having two pairs of opposite corners, and the electrical contacts may be grouped toward the center of the surface. In this case, the alignment marks are preferably positioned in opposite corners of the surface of the interface circuit.

The alignment marks may advantageously be electrical contacts formed simultaneously with, and having physical dimensions identical to, the set of electrical contacts which interface with the contact probes. The electrical contacts and the alignment marks may be, for example, round metal pads. In this case, the alignment holes may be cylindrical and have a diameter greater than the diameter of the alignment marks. This configuration would allow an operator to center the alignment marks in circular ends of the alignment holes, thus aiding in the visual alignment process.

The present method for ensuring electrical contact between the contact probes of the probe head assembly and the electrical contacts of the interface circuit includes bringing one surface of the probe head body into contact with the surface of interface circuit such that the surface of the interface circuit closes a first end of each of the alignment holes. A second end of each of the alignment holes opposite the surface of the interface circuit remains open. One of the alignment holes is then selected. Optical illumination (e.g., light) is directed into the open end of the selected alignment hole. A portion of the optical illumination reflected from the surface of interface circuit at the closed end of the selected alignment hole and exiting the open end of the selected alignment hole is visually detected by an operator's eye. Such visual detection may be aided by a magnifying lens or microscope. The surface of the probe head body in contact with the surface of the interface circuit is slid along the surface of the interface circuit until the alignment mark corresponding to the selected alignment hole is visible at the closed end of the selected alignment hole. For example, a circular alignment mark may be centered in the larger circular cross section of a cylindrical alignment hole. The above selecting, directing, detecting, and sliding steps may be repeated until all of the alignment holes have been selected and the corresponding alignment marks are visible at the closed ends of all of the alignment holes. The position of the probe head body relative the interface circuit may then be fixed.

BRIEF DESCRIPTION OF THE DRAWINGS

Other objects and advantages of the invention will become apparent upon reading the following detailed description and upon reference to the accompanying drawings in which.

Figure 1:
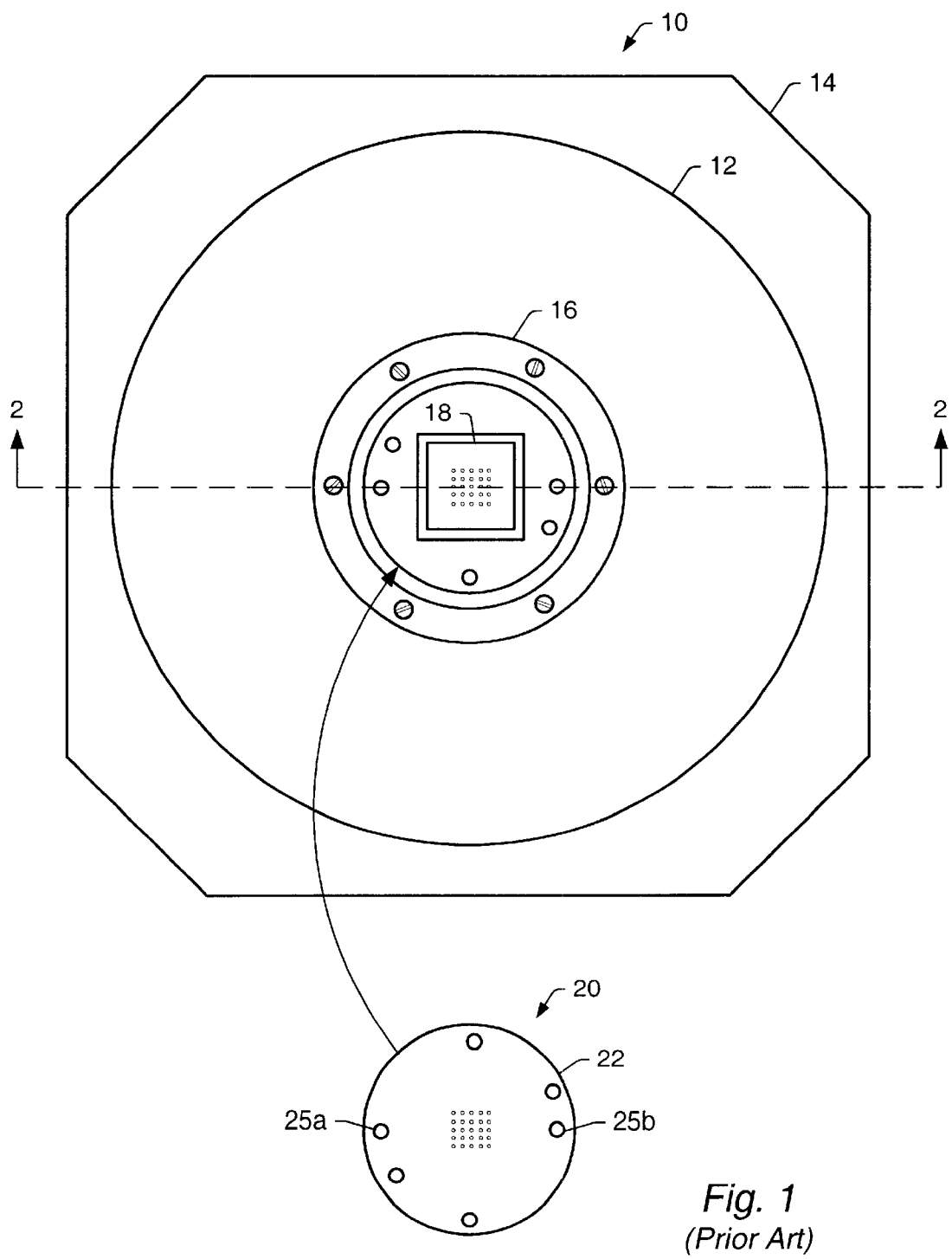
FIG. 1 is a bottom plan view of a typical probe card, wherein the probe card includes an interface circuit attached to a printed circuit board (PCB) and a probe head assembly including a probe head body, and wherein during assembly of the probe card one of two opposed surfaces of the probe head body is brought into coupled alignment with a surface of the interface circuit opposite the PCB.
Figure 2:
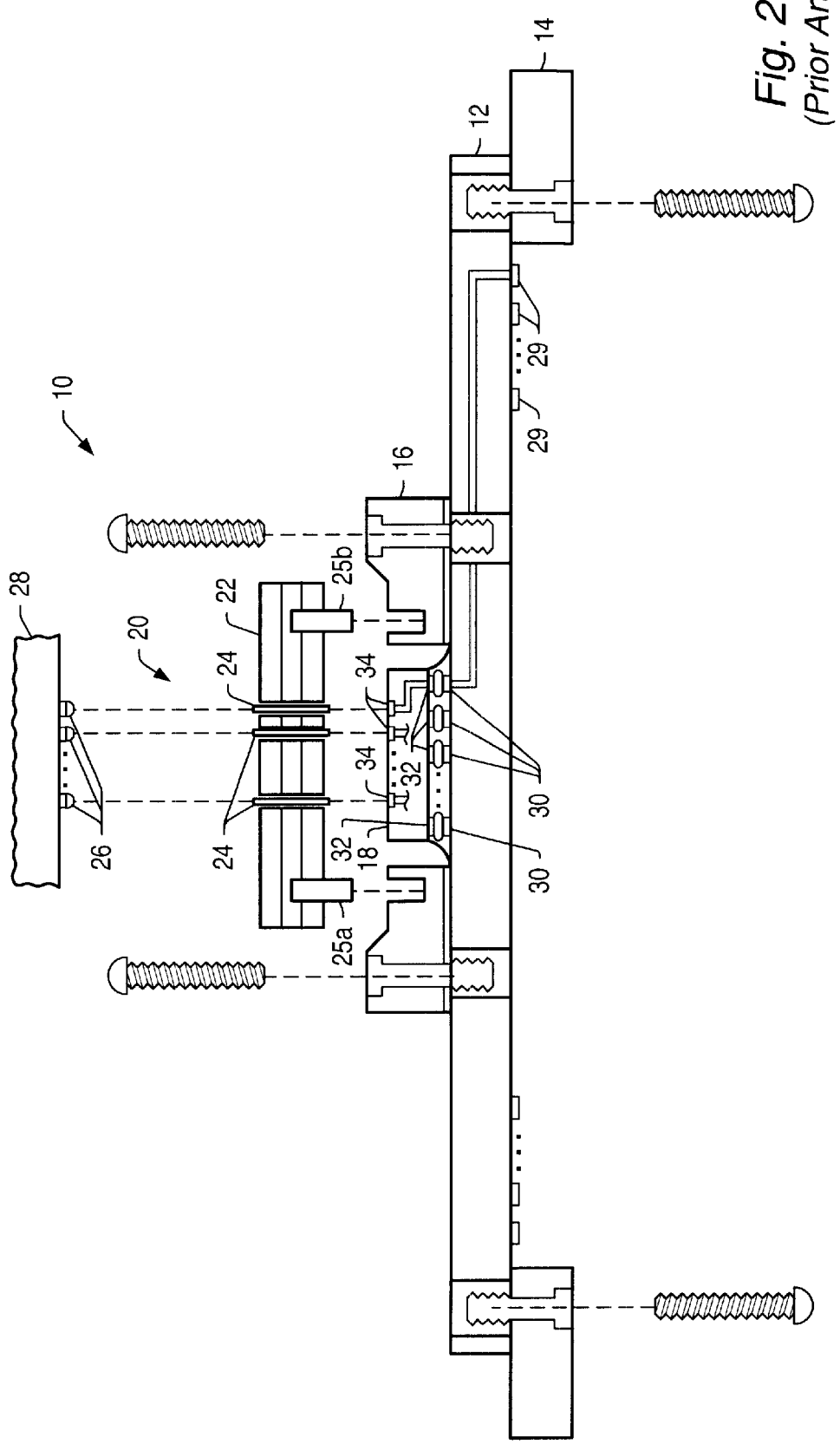
FIG. 2 is a sectional view of the typical probe card as indicated in FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 3:
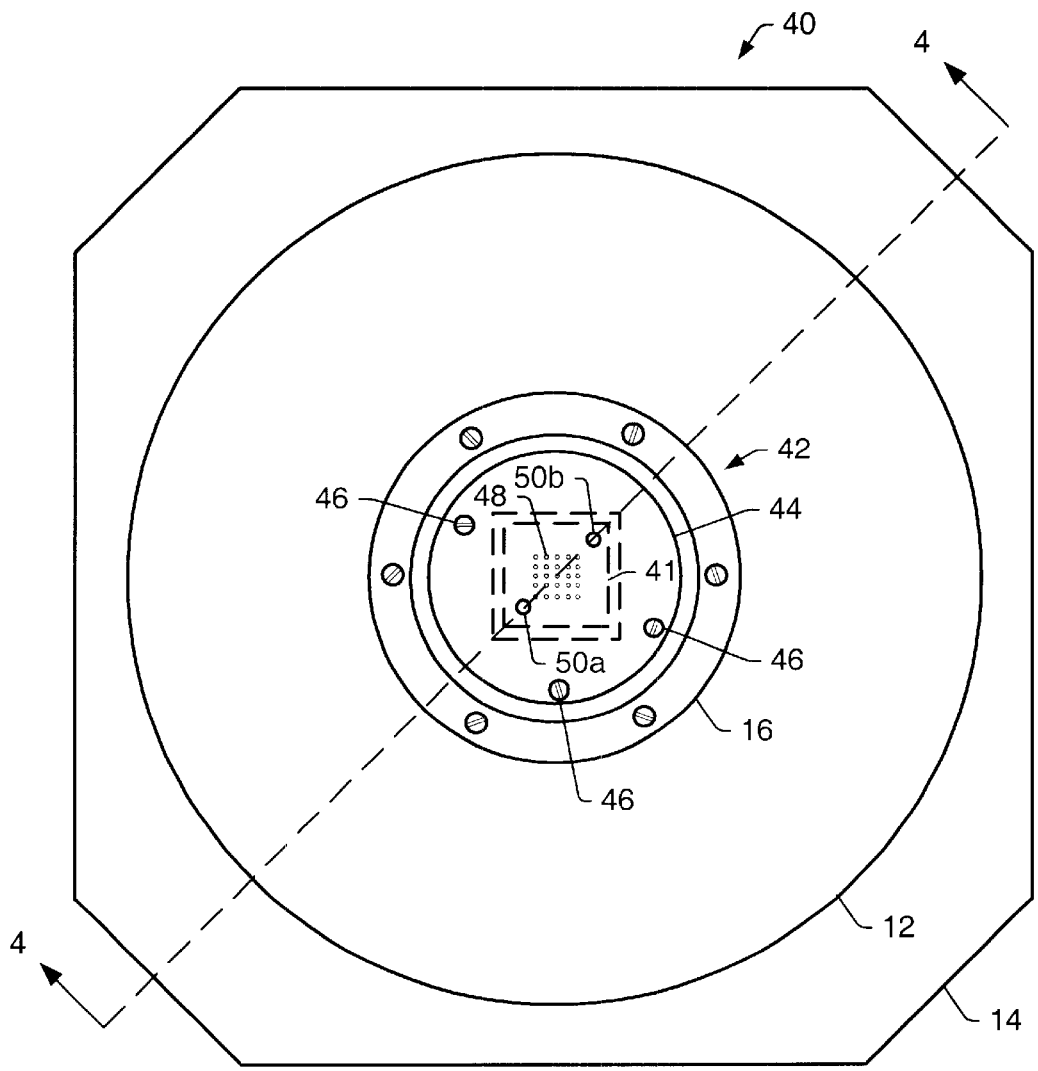
FIG. 3 is a bottom plan view of one embodiment of a probe card in accordance with the present invention, wherein the probe card includes an interface circuit attached to a PCB and a probe head assembly including a probe head body, and wherein one of two opposed surfaces of the probe head body is in coupled alignment with a surface of the interface circuit opposite the PCB, and wherein alignment marks are present on the surface of the interface circuit, and wherein the probe head body includes alignment holes extending between the opposed surfaces and corresponding to the alignment marks.

FIG. 3 is a bottom plan view of one embodiment of a probe card 40 in accordance with the present invention. Probe card 40 includes circular PCB 12, mounting ring 14, and alignment ring 16 as described above. Probe card 40 also includes an interface circuit 41 and a probe head assembly 42. Probe head assembly 42 includes a probe head body 44 attached to alignment ring 16 by three screws 46. A set of contact probes project from an outward-facing surface of probe head body 44, and are arranged within a region 48 substantially in the center of probe head body 44. Two alignment holes 50a–b, generally referred to as alignment holes 50, are spaced laterally outside of region 48 between region 48 and a periphery of the surface of probe head body. Adapted to pass optical illumination, alignment holes 50a–b are used to visually align probe head body 44 with interface circuit 41.

Figure 4:
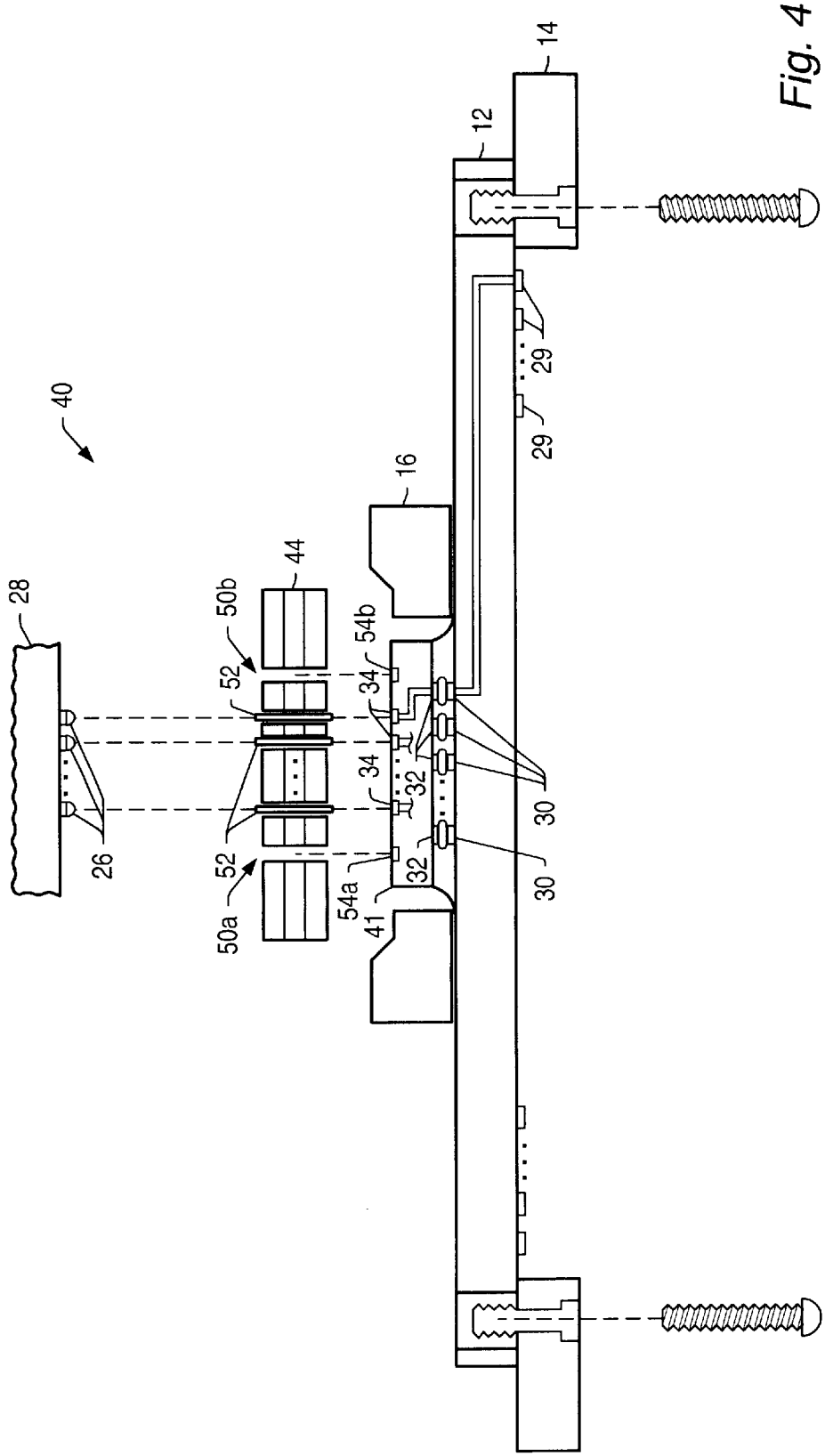
FIG. 4 is a sectional view of the probe card as indicated in FIG. 3.

FIG. 4 is a sectional view of probe card 40 as indicated in FIG. 3. Probe head body 44 has a pair of substantially planar opposed surfaces between which alignment holes 50a–b extend. Probe head body 44 also has a set of probe holes extending between the opposed surfaces. Probe head assembly 42 includes a set of contact probes 52 each having two ends. Each contact probe 52 extends through a probe hole in probe head body 44 such that the ends of the contact probe project outwardly from both opposed surfaces of probe head body 44. The probe holes are arranged according to a pattern defined by electrical contacts 26 on a surface of a device under test 28. Electrical contacts 26 may include solder bumps formed upon flat metal pads as depicted in FIG. 4.

PCB 12 includes bonding pads 29, bonding pads 30, and electrically conductive metal traces which interconnect bonding pads 29 and bonding pads 30 as described above. Bonding pads 29 are connected to the test system, and bonding pads 30 are connected to corresponding bonding pads of interface circuit 41.

Like interface circuit 18 described above, interface circuit 41 has two opposed surfaces, bonding pads 32 arranged on one of the two opposed surfaces, and contact pads 34 arranged on the other of the two opposed surfaces. Bonding pads 32 are arranged on a surface of interface circuit 41 adjacent to PCB 12, and are connected to corresponding bonding pads 30 of PCB 12. Contact pads 34 are electrically conductive flat metal pads formed flush with a surface of interface circuit 41 opposite PCB 12. As described above, contact pads 34 are arranged according to the pattern defined by electrical contacts 26 on the surface of device under test 28. Interface circuit 41 includes electrically conductive metal traces, insulated by a dielectric (e.g., ceramic) material, which interconnect bonding pads 32 and contact pads 34.

The probe holes in probe head body 44 are also arranged according to the pattern defined by electrical contacts 26 on the surface of device under test 28. As a result, each probe hole in probe head body 44, and each contact probe 52 residing in a probe hole, has both a corresponding electrical contact 26 on the surface of device under test 28 and a corresponding contact pad 34 on the surface of interface circuit 41.

Interface circuit 41 also includes two alignment marks 54a–b, generally referred to as alignment marks 54, formed upon the same surface as contact pads 34. Contact pads 34 are grouped in a central region of interface circuit 41, and alignment marks 54a–b are spaced laterally outside of the central region. Each alignment mark 54 is positioned between the central region and a periphery of the surface. Alignment marks 54a–b define a pattern, and alignment holes 50a–b are arranged according to the pattern defined by alignment marks 54a–b such that alignment hole 50a corresponds to alignment mark 54a and alignment hole 50b corresponds to alignment mark 54b During attachment of probe head body 44 to alignment ring 16, one surface of probe head body 44 contacts the surface of interface circuit 41 opposite PCB 12. When ends of contact probes 52 contact corresponding contact pads 34 of interface circuit 41, probe head body 44 is properly aligned with interface circuit 41, and optical illumination (e.g., light) passing through any one of the alignment holes 50 illuminates the corresponding alignment mark 54 on the surface of interface circuit 41. In other words, any of the alignment marks 54 may be viewed through the corresponding alignment hole 50 with the aid of optical illumination directed into the corresponding alignment hole 50.

In the embodiment of FIGS. 3–4, the surface of interface circuit 41 opposite PCB 12 is rectangular and has two pairs of opposite corners. Alignment marks 54a–b are positioned in opposite corners of the surface of interface circuit 41 opposite PCB 12. Alignment marks 54 may be contact pads formed simultaneously with, and having physical dimensions identical to, contact pads 34. Contact pads 34, and alignment marks 54, may be round metal pads. In this case, alignment holes 50 are preferably cylindrical and have diameters greater than the diameters of circular alignment marks 54.

Figure 5:
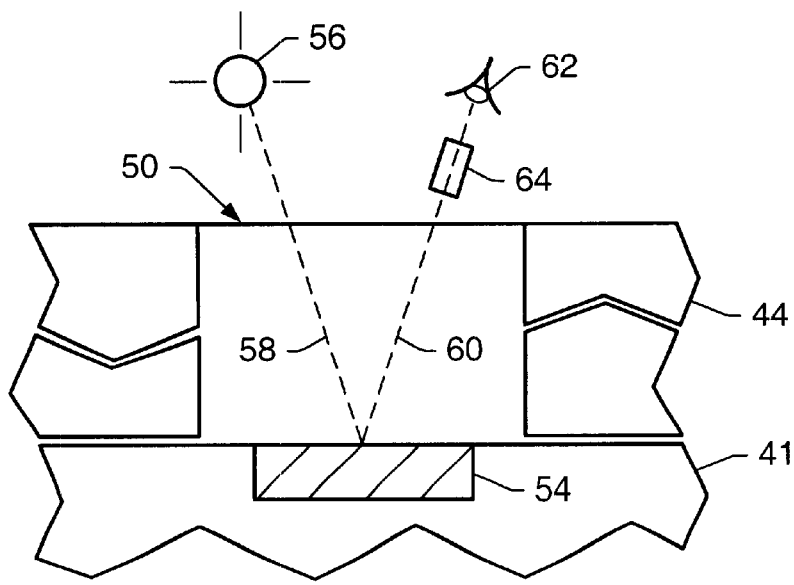
FIG. 5 is a sectional view of one embodiment of an alignment mark and corresponding alignment hole of the probe card of FIG. 3 illustrating a method for aligning the probe head body with the interface circuit, wherein optical illumination directed into one end of the alignment hole is used to illuminate the corresponding alignment mark at an opposite end of the alignment hole.
Figure 6:
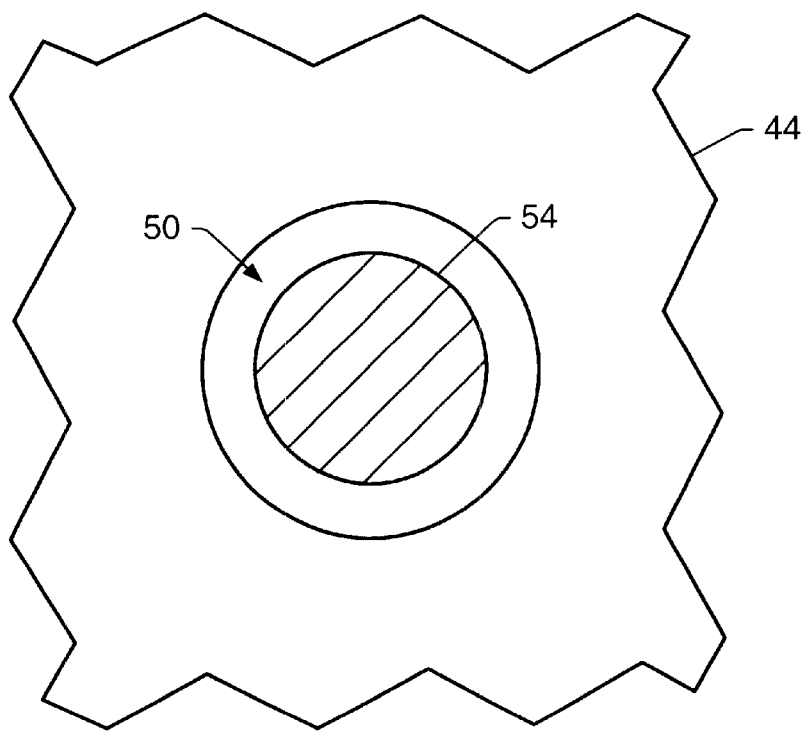
FIG. 6 is a bottom plan view of the embodiment of the alignment mark and alignment hole of FIG. 5, wherein the alignment mark is circular, and wherein the alignment hole is cylindrical and has a diameter greater that the diameter of the alignment mark, and wherein when the probe head body is properly aligned with the interface circuit, the alignment mark is centered in the alignment hole.

FIGS. 5 and 6 will now be used to describe a method for aligning probe head body 44 with interface circuit 41 in order to form an electrical interface between the test system and device under test 28. FIG. 5 is a sectional view of one embodiment of alignment mark 54 and corresponding alignment hole 50 of probe card 40 illustrating the present alignment method. FIG. 6 is a bottom plan view of the embodiment of alignment mark 54 and corresponding alignment hole 50 of FIG. 5 illustrating the present alignment method. In the embodiment of FIGS. 5 and 6, each alignment mark 54 is a circular contact pad, and each alignment hole 50 is cylindrical and has a diameter greater than the diameter of the corresponding circular alignment mark 54.

The present alignment method includes bringing one surface of probe head body 44 into contact with the surface of interface circuit 41 opposite PCB 12 such that the surface of interface circuit 41 closes one of each alignment hole 50 as shown in FIG. 5. A second end of each alignment hole 50 opposite the surface of interface circuit 41 remains open.

One of the alignment holes 50 is then selected. A source of optical illumination 56 (e.g., light) is activated, and optical illumination 58 produced by source 56 is directed into the open end of the selected alignment hole 50. A portion of optical illumination 58 reflected from the surface of interface circuit 41 at the closed end of the selected alignment hole 50 (i.e., a reflected portion 60) exiting the open end of the selected alignment hole 50 is visually detected by an operator's eye 62. Such visual detection may be aided by a magnifying lens or microscope 64. The surface of probe head body 44 in contact with the surface of interface circuit 41 is slid along the surface of interface circuit 41 until the alignment mark 54 corresponding to the selected alignment hole 50 is visible at the closed end of the selected alignment hole 50. In the embodiment of FIGS. 5 and 6, the circular alignment mark 54 is centered in the larger circular cross section of the cylindrical alignment hole 50. FIG. 6 illustrates what the operator sees when looking into the selected alignment hole 50 and probe head body 44 is properly aligned with interface circuit 41. The above selecting, directing, detecting, and sliding steps are repeated until all of the alignment holes have been selected and the corresponding alignment marks 54 are visible at the closed ends of all of the alignment holes 50. The position of probe head body 44 relative interface circuit 41 may then be fixed using screws 46.

It will be appreciated by those skilled in the art having the benefit of this disclosure that this invention is believed to be an electrical test probe card including a removable probe head assembly with alignment features, and a method for aligning the probe head assembly to the remainder of the probe card. It is intended that the following claims be interpreted to embrace all such modifications and changes and, accordingly, the specification and drawings are to be regarded in an illustrative rather than a restrictive sense.

What is claimed is:

1. A probe head assembly for providing an electrical interface between an interface circuit and a device under test, comprising a probe head body including a pair of opposed surfaces, wherein an array of probe holes and a set of alignment holes extend between the opposed surfaces, wherein the array of probe holes is grouped in a central region of the interface circuit, wherein the alignment holes are spaced laterally outside of the central region, wherein the array of probe holes is adapted to receive an electrically conductive probe, wherein the set of alignment holes is adapted to pass optical illumination used to align the probe head body with the interface circuit, and wherein the alignment holes have a lateral dimension larger than a lateral dimension of corresponding alignment marks on the interface circuit.

2. The probe head assembly as recited in claim 1, wherein members of the array of probe holes are arranged according to a first pattern defined by a set of electrical contacts on a surface of the device under test such that the probe holes have corresponding electrical contacts on the surface of the device under test.

3. The probe head assembly as recited in claim 2, wherein the interface circuit comprises a set of electrical contacts and a set of the alignment marks formed upon a surface, wherein members of the set of electrical contacts are arranged according to the first pattern such that the probe holes have corresponding electrical contacts on the surface of the interface circuit, and wherein the alignment marks define a second pattern.

4. The probe head assembly as recited in claim 3, wherein members of the set of alignment holes are arranged according to the second pattern such that the alignment holes correspond to the alignment marks on the surface of the interface circuit.

5. The probe head assembly as recited in claim 4, further comprising a set of contact probes each having two opposed ends, wherein each contact probe extends through a member of the array of probe holes such that: (i) the ends of the contact probes project outwardly from the opposed surfaces of the probe head body, and (ii) each contact probe has a corresponding electrical contact on the surface of the interface circuit.

6. The probe head assembly as recited in claim 5, wherein when one of the pair of opposed surfaces of the probe head body is brought into contact with the surface of the interface circuit and the ends of the contact probes contact the corresponding electrical contact on the surface of the interface circuit, the probe head body is properly aligned with the interface circuit, and the optical illumination passing through any member of the set of alignment holes illuminates the corresponding alignment mark upon the surface of the interface circuit.

* * * * *